US006853186B2

(12) United States Patent
Li

(10) Patent No.: US 6,853,186 B2
(45) Date of Patent: Feb. 8, 2005

(54) VARIABLE PERMEABILITY MAGNETIC FIELD SENSOR AND METHOD

(75) Inventor: Xiaoping Li, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/342,612

(22) Filed: Jan. 15, 2003

(65) Prior Publication Data

US 2003/0151405 A1 Aug. 14, 2003

Related U.S. Application Data

(60) Provisional application No. 60/348,668, filed on Jan. 15, 2002.

(51) Int. Cl.$^7$ .............................................. G01R 33/02
(52) U.S. Cl. ...................... 324/250; 324/244; 324/249; 324/260
(58) Field of Search ................................ 324/244, 249, 324/250, 253–255, 258–260, 117 R; 600/409; 235/449

(56) References Cited

U.S. PATENT DOCUMENTS

| | | | | |
|---|---|---|---|---|
| 3,239,754 A | * | 3/1966 | Odom, Jr. et al. | 324/247 |
| 3,421,075 A | * | 1/1969 | Belson | 324/249 |
| 5,020,538 A | | 6/1991 | Morgan et al. | |
| 5,323,777 A | | 6/1994 | Ahonen et al. | |
| 5,365,391 A | * | 11/1994 | Sugiyama et al. | 360/110 |
| 5,705,926 A | | 1/1998 | Senda et al. | |
| 5,757,184 A | | 5/1998 | Kurihara et al. | |
| 5,838,154 A | * | 11/1998 | Morikawa et al. | 324/249 |
| 5,885,215 A | | 3/1999 | Dossel et al. | |
| 6,069,475 A | * | 5/2000 | Isomura et al. | 324/244 |
| 6,194,897 B1 | * | 2/2001 | Fukunaga | 324/255 |
| 6,304,083 B1 | * | 10/2001 | Owens | 324/258 |
| 6,356,079 B1 | * | 3/2002 | Mizoguchi et al. | 324/249 |
| 6,414,564 B1 | * | 7/2002 | Mizoguchi et al. | 333/35 |

\* cited by examiner

*Primary Examiner*—Anjan Deb
*Assistant Examiner*—Darrell Kinder
(74) *Attorney, Agent, or Firm*—Dinsmore & Shohl LLP

(57) ABSTRACT

A magnetic field sensor relies on variations in permeability of magnetic material to detect an external field. An exemplary magnetic field sensor includes a magnetic material and two or more conductors, at least one of which is connected to an electrical energy source. Current flowing through at least one of the conductors establishes a magnetic field in die magnetic material at a magnitude at which there is a generally linear relationship between the magnetic field and the permeability of the material. An external field to be sensed influences the permeability of the material. Sensing variations in the permeability of the magnetic material allows the external magnetic field to be sensed. Preferably, the conductors are mutually coupled and exhibit a mutual inductance between each other so that detectable changes in the current distribution between the conductors caused by an external magnetic field may be detected while the net current flowing in the conductors remains sufficient to maintain a magnetic field of sufficient magnitude in the material.

14 Claims, 4 Drawing Sheets

VARIABLE PERMEABILITY MAGNETIC FIELD SENSOR AND METHOD

CROSS REFERENCE TO RELATED APPLICATIONS

This application claims benefits from U.S. Provisional Patent Application No. 60/348,668 filed Jan. 15, 2002, the contents of which are hereby incorporated herein by reference

FIELD OF THE INVENTION

This invention relates generally to sensing magnetic fields, and more particularly to methods and devices for sensing very small magnetic fields such as those emitted by a biological body.

BACKGROUND OF THE INVENTION

The body of a human being is governed by his/her brain. Understanding and monitoring brain activity could potentially improve the quality of life and work efficiency. Monitoring brain activity may, for example, aid in the cure of sleep disorders; in detecting sleep onset during attentive tasks such as driving; in detecting pilot blackout or disorientation in flight; in monitoring attention and consciousness; in and sensing brain activity of those not otherwise able to communicate.

All of these applications require portable devices that sense brain activities or status of consciousness. The brain works by communication between the neuron cells, which emit electrical pulses and thus produce an electrical field and an accompanied magnetic field. A current source in the neurons results in a current and thus causes an electrical field on the scalp. A corresponding potential difference may be detected (measured with EEG). Similarly, a magnetic field outside the head may be detected (measured with MEG). By measuring the electric or magnetic field, the activities of the brain can be detected.

As such, two known methods may be used to sense human brain activities—electroencephalography (EEG) and magnetoencephalography (MEG), which work by measuring the electric and magnetic fields corresponding to the brain activities, respectively. In EEG, electric signals measured through a set of electrodes (placed on the scalp of the subject) are amplified, digitized, and interpreted by using EEG software that creates real-time brain waves. In MEG, the data is a measurement of the accompanied magnetic field generated by the same electrical currents that produce the EEG data, and roughly resembles EEG recordings. Both EEG and MEG can be used to interpret brain activity. However, most existing EEG devices are suitable only for clinical or laboratory applications since the electrodes must be in contact with the subject's scalp. MEG measurement is non-contact and non-invasive and thus it could be suitable for both clinical and non-clinical applications.

However, the magnetic field intensity of the brain is very weak (typically at the level below $10^{-12}$ Tesla), therefore conventional methods of measuring magnetic fields, such as the field detection coils, the Hall element, the magneto-resistance (MR) element, the giant magneto-resistance (GMR) element, and the thin film fluxgate sensor (FGS) are not sensitive enough to detect the magnetic field of the brain.

The Superconducting Quantum Interference Device (SQUID) has remained to be the only commercially available medical apparatus that can detect the magnetic field of the brain. However, Since the SQUID uses field detection coils made of superconducting material operated at temperature –269° C. with circulated liquid helium cooling, it requires a huge cooling system and a magnetic shielding room, and thus its applications are limited to laboratory and clinical conditions It is expected that portable MEG devices equipped with micro MEG sensors have a potential for a spectrum of applications of non-contact sensing and monitoring of brain activities or status of consciousness.

Accordingly, there is a need for improved magnetic field sensors, and methods.

SUMMARY OF THE INVENTION

In accordance with the present invention, a magnetic field sensor relies on variations in permeability of magnetic material to detect an external field. An exemplary magnetic field sensor includes a magnetic material and two or more conductors, at least one of which is connected to an electrical energy source. Current flowing through at least one of the conductors establishes a magnetic field in the magnetic material at a magnitude at which there is a generally linear relationship between the magnetic field and the permeability of the material. An external field to be sensed influences the permeability of the material. Sensing variations in the permeability of the magnetic material allows the external magnetic field to be sensed.

Preferably, the conductors are mutually coupled and exhibit a mutual inductance between each other so that detectable changes in the current distribution between the conductors caused by an external magnetic field may be detected while the net current flowing in the conductors remains sufficient to maintain a magnetic field of sufficient magnitude in the material. The sensitivity of the sensor may be increased by increasing the number of conductors.

Advantageously, exemplary magnetic sensors are able to detect relatively weak external magnetic fields, such as those emitted by the human brain and other biological bodies. Such magnetic sensors may be used in a variety of applications involving non-contact sensing and monitoring of brain activities or status of consciousness. Furthermore, such sensors do not require cooling and lend themselves to portability and thin film formation.

In accordance with an aspect of the invention, there is provided a magnetic field sensor, including: a shell made of a magnetic material defining an interior; a first conductor within the interior; a second conductor within the interior, nested within the first conductor; the first and second conductors exhibiting a mutual inductance between each other; a source of electrical energy, interconnected with the first and second conductors, to establish an alternating electric current through at least one of the first and second conductors, and thereby a magnetic field in the shell; a monitor, interconnected with one of the first and second conductors, to monitor changes in current therethrough as the shell is brought into proximity with an external magnetic field, to sense a change in permeability of the magnetic material.

In accordance with another aspect of the invention, there is provided a magnetic field sensor, including a magnetic material; two mutually-coupled conductors driven by a source of alternating electricity to generate a magnetic field in the magnetic material, and mutually coupled so that a change in permeability of the magnetic material results in re-distribution of current through the conductors; a meter for measuring current through at least one of the first and second conductors to sense a change in permeability of the magnetic material caused by an external magnetic field, and thereby the external magnetic field.

In accordance with yet another aspect of the invention, there is provided a method of sensing an external magnetic field, including inducing a magnetic field in a magnetic element by providing alternating current through first and second mutually-coupled electric conductors; measuring a change in distribution of current in the two conductors, resulting from the external magnetic field varying permeability of the magnetic element.

In accordance with a further aspect of the invention, there is provided a magnetic field sensor, including a conductive core, surrounded by a magnetic layer; a coil wound about the magnetic layer; a source of electrical energy, providing electrical energy to the conductive core to establish a magnetic field in the magnetic layer, the magnetic field having a magnitude at which there is a linear relationship between the magnetic field and permeability of the magnetic layer; a sensor for detecting changes in voltage across the coil, resulting from changes in the permeability of the magnetic layer, attributable to an external magnetic field.

In accordance with another aspect of the invention, there is provided a method of sensing a low frequency external magnetic field including: exciting a magnetic element with a time varying magnetic field having a frequency and amplitude to maximize the sensitivity of the permeability of the magnetic element to the magnetic field in the magnetic element; sensing the external magnetic field by measuring variation of the permeability of the magnetic element, resulting from the external magnetic field.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In figures, which illustrate by way of example only, embodiments of the present invention.

DETAILED DESCRIPTION

Figure 1:
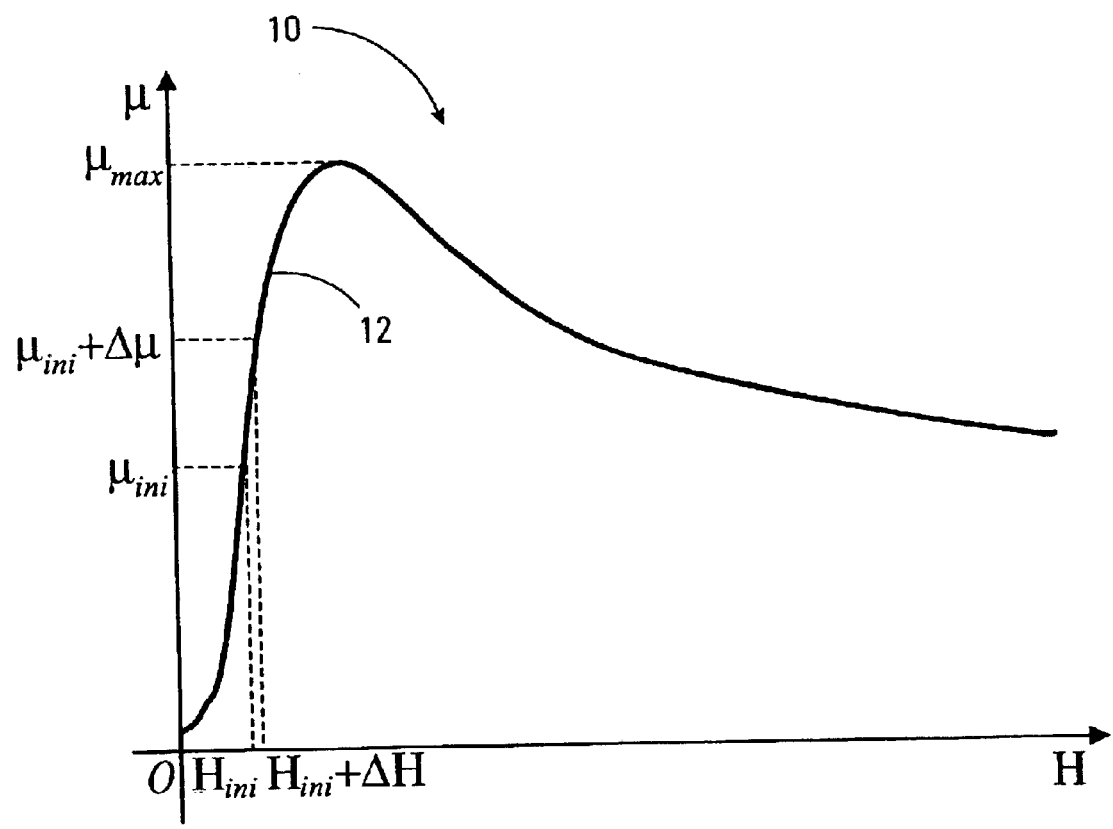
FIG. 1 is a $\mu$-H curve graphically illustrating the variation of permeability with magnetic field in a magnetic material used in example embodiments of the present invention.

FIG. 1 depicts a $\mu$-H curve 10 illustrating the relationship between the permeability ($\mu$) of a particular ferromagnetic material and a magnetic field in the material having a magnitude $|H_{core}|$. As illustrated, the permeability is highly dependent on the strength of magnetic field $H_{core}$ until the magnetic material is saturated. At saturation, the permeability remains relatively constant despite an increase in the magnetic field strength. In region 12, the variation of permeability $\mu$ is generally, and steeply, linear with $H_{core}$: a slight increase in H results in a significant increase in $$\mu \left( \text{i.e.} \ \frac{\Delta \mu}{\Delta H} \gg 1 \right).$$

Curve 10 illustrates the relationship between $\mu$ and $H_{core}$ for a particular range of frequencies of $H_{core}$ within the material. Empirically, it has been observed that the value of $\mu_{max}$ increases as the frequency of $H_{core}$ is increased. Thus, the sensitivity of $\mu$ in relation to $H_{core}$ may increase further in the presence of a time varying $H_{core}$. An optimal frequency of frequency for $H_{core}$, providing maximum sensitivity of $\mu$ in relation to $H_{core}$ may be determined for any particular material by trial and error.

As will become apparent, magnetic field sensors exemplary of embodiments of the present invention, exploit the increased permeability and generally linear relationship between $\mu$ and $H_{core}$ in a ferromagnetic material to detect the presence of an external magnetic field to be sensed. Conveniently, such sensors may detect very small magnetic fields (e.g. in the order of about $10^{-12}$ Tesla) and thus lend themselves to the detection of small magnetic fields emanating from a biological body, such as an animal or human brain. Such sensors are thus well suited for uses as MEG sensors.

Figure 2:
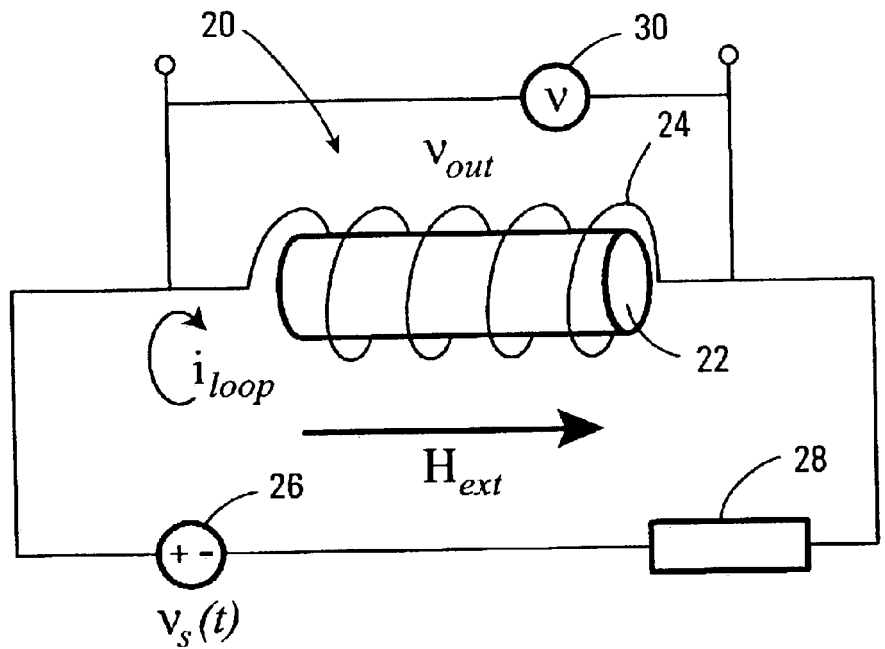
FIG. 2 is a simplified schematic diagram of a magnetic field sensor.

FIG. 2 illustrates a magnetic field sensor 20, in a form of ferromagnetic core inductor, including of a ferromagnetic core 22 surrounded by a coil 24. Core 22 is made of ferromagnetic material having a $\mu$-H curve generally as depicted in FIG. 1. Core 22 may, for example, be formed of NiFe, NiFeCo, Co-based amorphous material, Fe-based nano-crystalline material, a ferrite, or similar material. Coil 24 is formed of a conducting material, such as copper and is connected as part of an alternating current (AC) circuit having an AC voltage source 26 and a controller 28. For sensing the external magnetic field, AC source 26 provides a generally constant alternating current $i_{loop}$ flowing in the coil 24. A generally constant current source (such as AC source 26 and controller 28) may be formed in any number of ways. Controller 28 may for example take the form of a simple current limiting resistor.

The alternating current $i_{loop}$ induces a magnetic field $H_{source}$ in core 22 along the axis of core 22, which, in turn, magnetizes the core 22. The degree of magnetization of the core depends on its permeability. Preferably, AC source 26 is operated to provide an $H_{source}$ having an optimal frequency, maximizing the sensitivity of $\mu$ in relation to $H_{core}$. $H_{source}$ brings $H_{core}$ within the linear region of the $\mu$-H curve for the material, at the operating frequency of source 26. That is, source 26 is controlled so that $H_{core}$ within ferromagnetic core 22 is in a range where the relationship between H and $\mu$ is generally steeply linear. Due to the magnetic flux generated in the ferromagnetic core 22, coil 24 experiences a self-inductance resisting the variation of the alternating current in coil 24. The voltage across coil 24 may be measured by a monitoring device such as voltmeter 30. The magnitude of this self-inductance depends on, among other things, the size, shape and number of turns of coil 24. These characteristics are static and depend on design choice.

The self-inductance also depends on the permeability of the ferromagnetic core 22. This permeability varies in relation to the magnetizing field $H_{core}$ including the magnetic field $H_{source}$ generated by the current in the coil 24 and any external magnetic field.

In operation then, an external magnetic field ($H_{ext}$) to be sensed acts on core 22 in the direction of the axis of core 22.

This external field, $H_{ext}$, is coupled to core 22 and thus increases $H_{core}$ in core 22 from $H_{source}$ to $H_{source}+H_{ext}$. This increase in $H_{core}$ causes a change in the permeability of core 22 from $\mu_0$ to $\mu_0+\Delta\mu$ (as for example illustrated in FIG. 1). This increases the self-inductance of coil 24 and hence its impedance. The change in impedance causes a change in voltage across coil 24. As $i_{loop}$ is kept constant, the variation of the external magnetic field intensity $H_{ext}$ may be determined by measuring the variation of the voltage across coil 24 at voltmeter 30. For low frequency external magnetic fields (about 100 Hz) voltage induced by the external field may be ignored. Nevertheless, accurately, detecting small values of $H_{ext}$ and very slight variations in $H_{ext}$ becomes difficult because of the multiple mechanisms affecting voltage across coil 24: $V_{out}$ reflects changes in permeability, and $H_{ext}$ and $H_{source}$.

Figure 3:
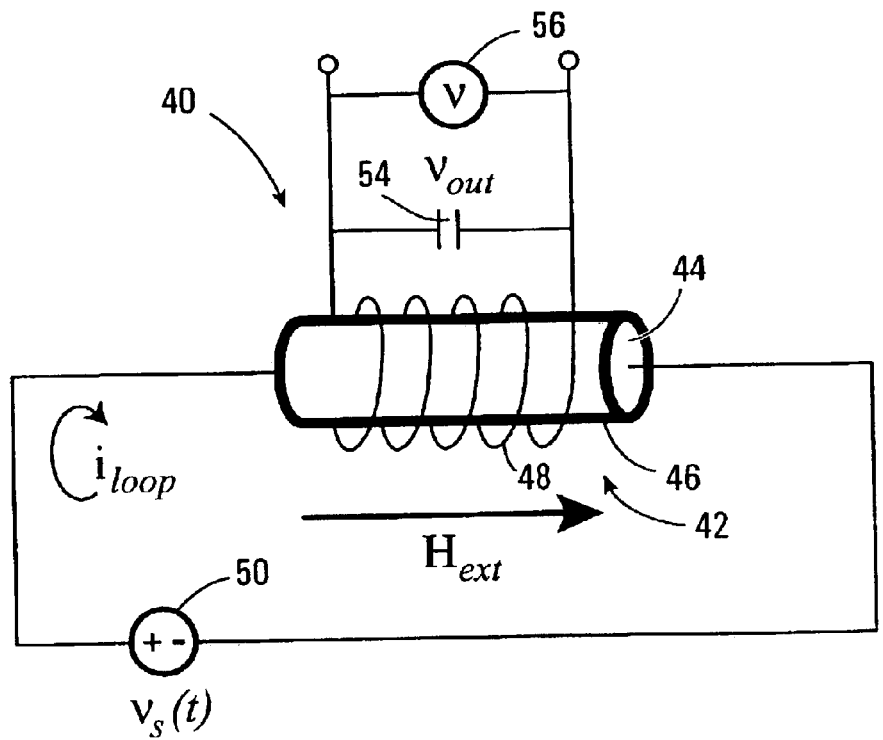
FIG. 3 is a simplified schematic diagram of another magnetic field sensor, exemplary of an embodiment of the present invention.

FIG. 3 therefore illustrates an alternate magnetic field sensor 40. Sensor 40 may be formed by a sensing element 42 of ferromagnetic composite wire or thin film having a conductive core 44 coated with a high permeability magnetic layer 46, and an induction coil 48 coiled about ferromagnetic layer 46. Optionally, an insulating layer (not shown) may be provided between conductive core 44 and ferromagnetic layer 46. Sensing element 42 is connected to a circuit of an alternating current source 50, generating an alternating loop current $i_{loop}$. Induction coil 48 is connected in parallel with a capacitor 54. The voltage across coil 48 and capacitor 54 may be measured by a monitoring device such as voltmeter 56.

In operation, sensing element 42 is driven by the AC current provided by source 50 to provide a magnetic field $H_{source}$ in the ferromagnetic layer 46 bringing its magnetic permeability to a linear region on the $\mu$-H curve. Preferably, source 50 is driven at a frequency providing a high measurable $\mu_{max}$ and high sensitivity of $\mu$ in relation to $H_{core}$. Unlike in sensor 20 (FIG. 2) the magnetic field $H_{source}$ attributable to source 50 in sensing element 42 is generated circumferentially around the central axis of core 44. As such, the variation of $H_{source}$ does not directly induce a current in coil 48. However, in the absence of an external field, the permeability of layer 46 varies with the frequency and magnitude of the AC driving current from source 50 in all directions and thus the magnetic flux in magnetic material 46 varies along the lengthwise extending axis of sensing element 42. This change results in a change in inductance as seen by coil 48 and induces a current in coil 48 or an electrical potential difference $V_{out}=V_0$ across coil 48.

In the presence of an external magnetic field, $H_{ext}$, the permeability of sensing element 42 further changes, causing additional variation of magnetic flux in sensing element 42, thus inducing additional current in coil 48 or additional electrical potential difference across coil 48, giving a value of $V_{out}$ different from $V_0$. The difference between the two values ($V_{out}-V_0$) reflects $H_{ext}$.

In order to assist in sensing changes in $V_{out}$ the value of capacitor 54 is chosen so that the resonant frequency of the circuit including capacitor 54 and coil 48 equals the AC current through sensing element 42.

Unfortunately, the presence of coils 24 and 48 make formation of sensors 20 and 40 using thin films difficult, if not impossible.

Figure 4:
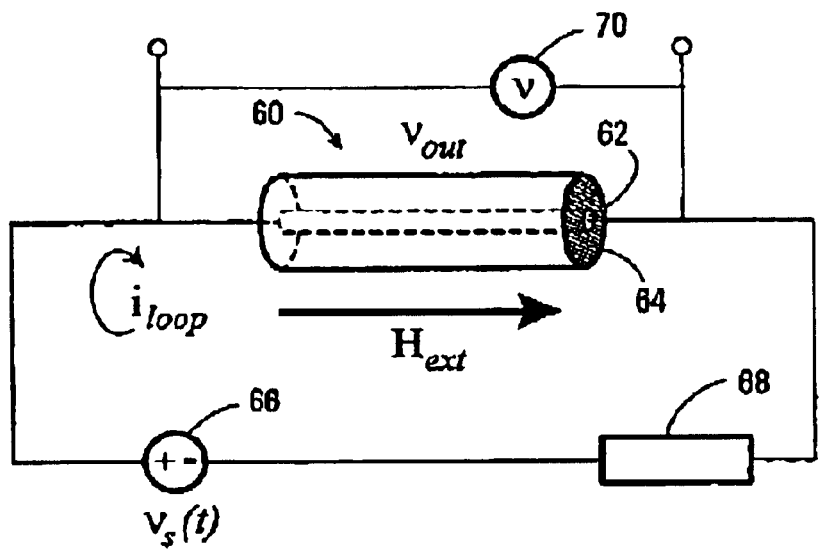
FIG. 4 is a simplified schematic diagram of a further magnetic field sensor.

As such, FIG. 4 illustrates a further magnetic field sensor 60, in a form of self-inductance composite wire inductor, including an insulated conductive wire 62 surrounded by a ferromagnetic shell 64. Again shell 64 may be formed of NiFe, NiFeCo, Co-based amorphous material, Fe-based nano-crystalline material, a ferrite, or similar material. Conductive wire 62 is connected to a circuit having an AC source 66 and a controller 68. Conductive wire 62 is of high conductivity. For sensing an external magnetic field, an alternating current flows in the conductive wire 62, generating a circumferential magnetic field $H_{core}=H_{source}$ which magnetizes ferromagnetic shell 64. The magnetization $H_{core}$ depends on the magnetic permeability of ferromagnetic shell 64. The alternating current flowing in the conductive wire 62 is arranged such that the permeability of the ferromagnetic shell 64 is excited to a dynamic state in variation with external magnetic field. Again, AC source 66 is operated to provide an $H_{source}$ having an optimal frequency, maximizing the sensitivity of $\mu$ in relation to $H_{core}$. The magnetic flux in ferromagnetic shell 64 resists a change in current through conductive wire 62, thereby producing a self-inductance on the conductive wire 62. The voltage across wire 62 may be measured by a monitoring device such as voltmeter 70. The self-inductance of wire 62 varies as the magnetic permeability of the ferromagnetic shell 64 varies with the magnetizing field, including any external magnetic field.

In operation, an external magnetic field parallel to the axis of the conductive wire 62, $H_{ext}$, changes the permeability of shell 64, and thereby the self-inductance of wire 62 and its impedance. The change in permeability, in turn, induces an electrical potential difference $V_{out}$ at terminals across the conductive wire 62. Sensing voltage $V_{out}$ provides an indicator of the magnitude of the external magnetic field $H_{ext}$. Conveniently, as $H_{ext}$ is parallel to wire 62 it does not directly induce a current in wire 62.

However, again, as should be appreciated in the presence $H_{ext}$, the self-inductance and thus impedance of conductive wire 62 increases. This increase in self-inductance results in an increased impedance of conductive wire 62. This, in turn, results in a decrease in the current in $i_{loop}$. As a consequence the magnetic field in core 64 attributable to source 66 $H_{source}$ decreases. The combination of an increase in $H_{ext}$ and a decrease in $H_{source}$ may be difficult to meaningfully measure. Moreover, possibly, the change in $H_{core}$ brought on by the decrease in $H_{source}$ may move $H_{core}$ out of the linear region on the $\mu$-H curve.

Figure 5:
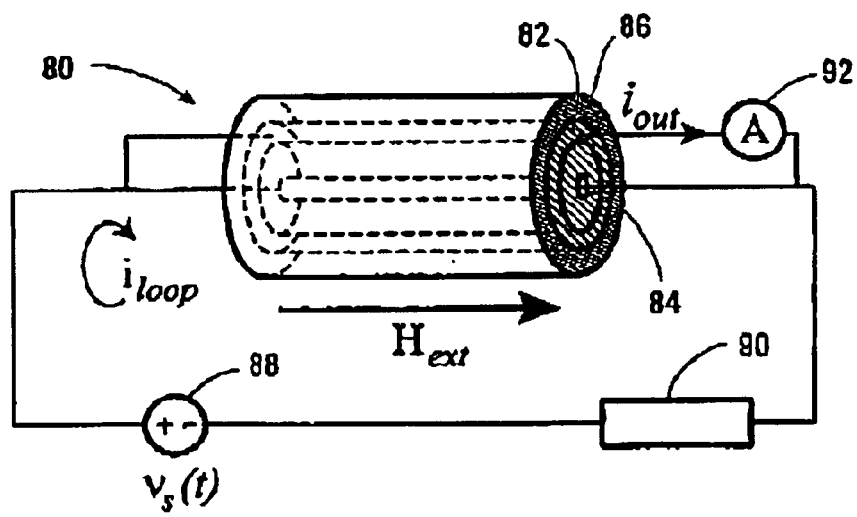
FIGS. 5 and 6 are simplified schematic diagrams of a magnetic field sensor, exemplary of other embodiments of the present invention.

FIG. 5 therefore illustrates further embodiment of a magnetic sensor 80 exemplary of an embodiment of the present invention. Sensor 80 includes first and second lengthwise extending nested conductors 82 and 84. As illustrated, example outer conductor 82 takes the form of an insulated cylinder. Inner conductor 84, nested within the exterior conductor 82, takes the form of lengthwise extending wire, having a generally uniform cross-section. Preferably, the cross-sectional area of outer conductor 82 is significantly larger than that of inner conductor 84. Inner conductor 84 is also preferably surrounded by an insulation layer (oxide, for example) electrically insulating conductor 82 from conductor 84.

Both the outer conductor 82 and inner conductor 84 are made of high conductivity materials and are connected to a circuit having an AC source 88 and a controller 90. AC source 88 and controller 90 provide a generally constant loop current $i_{loop}$. As illustrated, inner and outer conductors 84 and 82 are electrically connected in parallel. As such, current through each conductor is proportional to the impedance of the other conductor. Current through one of the conductors (e.g. conductor 82) may be measured by a monitoring device such as ammeter 92.

A ferromagnetic shell 86 of generally uniform thickness covers the exterior of outer conductor 82. Again shell 86 may be formed of NiFe, NiFeCo, Co-based amorphous material, Fe-based nano-crystalline material, a ferrite, or similar material. As a result of the geometry of sensor 80, magnetic flux attributable to current in inner conductor 84 is coupled to shell 86. Similarly, flux attributable to current in outer conductor 82 is coupled to shell 86. As such, there is a mutual inductance between inner and outer conductors.

In operation, $i_{loop}$ flows in the loop including voltage source 88, inducing a circumferential magnetic field as a result of the current flowing in outer conductor 82 and the current flowing in inner conductor 84. Ferromagnetic shell 86 is magnetized by the circumferential magnetic field. Source 88 provides sufficient AC current in outer conductor 82 so that the permeability of the ferromagnetic shell 86 is excited to a linear point on the $\mu$-H curve, providing sensitivity between $\mu$ and H. Again, source 88 is operated to provide an $H_{source}$ having an optimal frequency, maximizing the sensitivity of $\mu$ in relation to $H_{core}$.

Shell 86 is brought into proximity with the source of the external magnetic field to be sensed so as to couple the external magnetic field to shell 86 in a direction parallel to the axis of the ferromagnetic shell 86. This results in a change in the self and mutual inductance of both inner and outer conductors 84 and 82, and a change in the flow of current in both these conductors. As will be appreciated, the self and mutual inductance of inner conductor 84 is significantly more sensitive than that of outer conductor 82. As such, the impedance of inner conductor 84 is affected more significantly than that of outer conductor 82.

Conveniently, increases in the permeability of core 86 results in increases of the inductance of both inner and outer conductors 84 and 82. However, as the current $i_{loop}$ remains generally constant, a decrease in current in inner conductor 84 resulting from an increased inductance of inner conductor 84 results in increased current flowing through outer conductor 82. As a result, current in outer conductor 82 continues to ensure that core 86 is magnetized to operate within the linear region of $\mu$-H curve for core 86.

Keeping $i_{loop}$ generally constant, the external magnetic field $H_{ext}$ can be sensed by measuring the variation of the current flowing through the outer conductor 82 $i_{out}$.

Advantageously, use of two conductors 82 and 84, allows a change in permeability to be sensed by sensing the relative change in inductance (self and mutual) of conductors 82 and 84. As such, very small absolute changes in inductance may be reflected in significant and detectable changes in current flow in these conductors.

Figure 6:
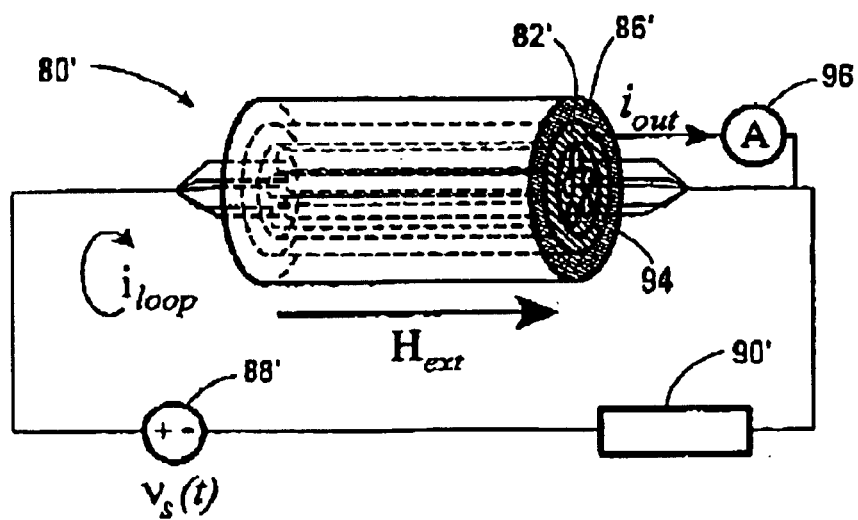

FIG. 6 shows a further example sensor 80', substantially similar to sensor 80 (FIG. 5). Like elements are thus labeled with like numerals but include a prime (') symbol. As illustrated, instead of a single interior conductor 84, sensor 80', includes a plurality (n) of parallel inner conductors 94. Again, the conducting surface area of outer conductor 82' is larger than the area of each self-inductance of conductors 94. Both the outer conductor 82' and self-inductance wires 94 are made of high conductivity materials and are connected in parallel to a circuit having an AC source 88' and a controller 90'. For sensing the external magnetic field as an alternating current flows in the circuit, a circumferential magnetic field is generated by the current in the outer conductor 82' and in addition by the currents flowing in the inner conductors 94.

In operation, the ferromagnetic shell 86' is magnetized by this circumferential magnetic field generated by conductors 82' and 94 and by the magnetic field to be sensed, $H_{ext}$ in parallel to the axis of the ferromagnetic shell 86'. Source 88' provides sufficient AC loop current flowing through the outer-conductor 82' so that the permeability of the ferromagnetic shell 86' is excited to a dynamic state in the linear region of the $\mu$-H curve, in the absence of an external magnetic field. In the presence of an external magnetic field, conductors 82' and 94 experience a change in self and mutual inductance. Again the inductance of each of conductors 94 will be more significant than the change in inductance on the outer conductor 82'. As $i_{loop}$ is generally constant, current passing through each of inner conductors 94 decreases and current through outer conductor 32' increases. As there are plurality of inner conductors 94, changes in current in outer conductor 82' win be more significant than in the presence of a single inner conductor. Again, the external magnetic field intensity $H_{ext}$ can be determined by measuring the variation of the current flowing through the outer conductor 82' $i_{out}$ by a monitoring device such as ammeter 96.

Advantageously sensor 80' as described with reference to FIG. 6, unlike sensor 80 (FIG. 5), includes more than one embedded inner conductor nested within the outer conductor. As a result, the sensitivity to the external field can be substantially increased by increasing the number of the interior conductors as well as the length of the sensing element can be shortened.

Figure 7:
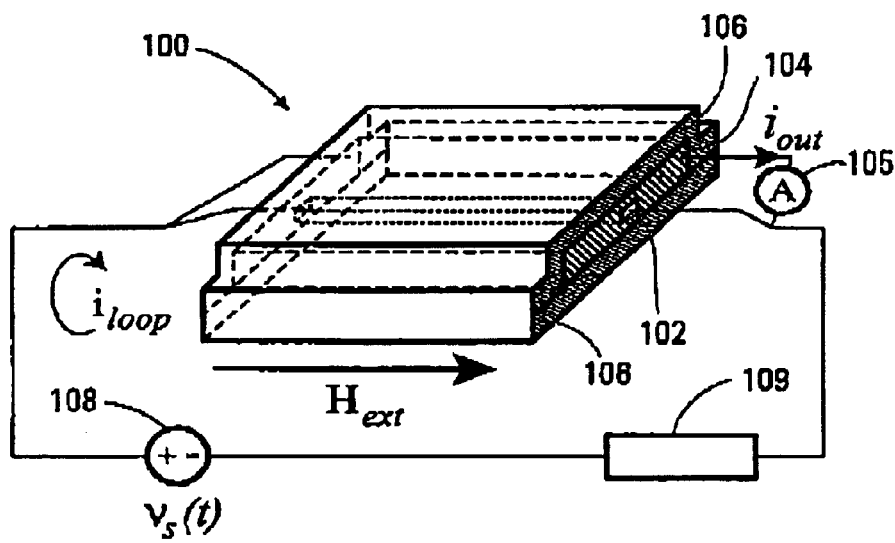
FIGS. 7 and 8 illustrate thin film magnetic field sensors, exemplary of embodiments of the present invention.
Figure 8:
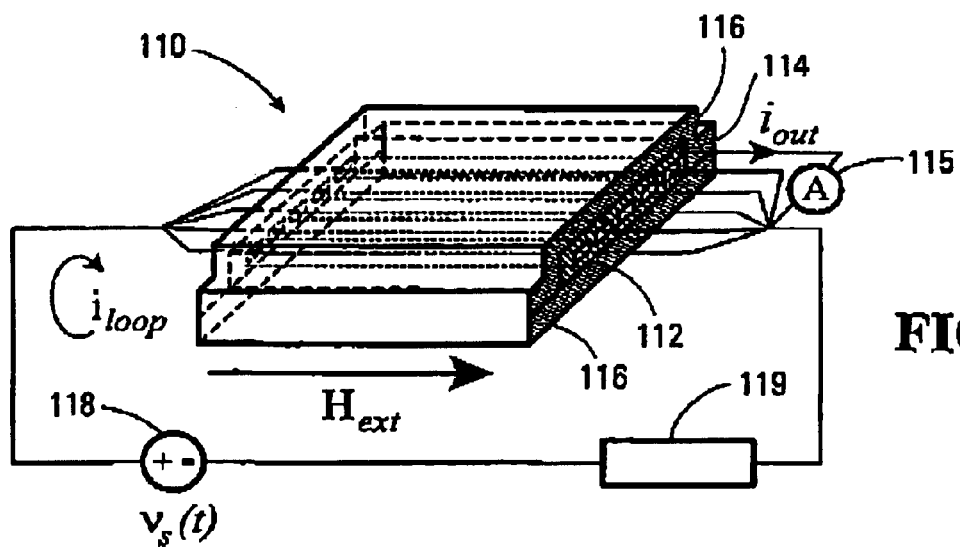

Conveniently, sensors 100 and 110 functionally similar to sensors 80 and 80' (FIGS. 5 and 6) may be formed as thin film sensors as illustrated in FIGS. 7 and 8. As illustrated, inner conductors 102 (112) may be formed as insulated metal strips embedded nested within outer conductors 104 (114) within a ferromagnetic shell 106 (or 116). Again, the cross-sectional urea of inner conductors 102 (112) is significantly smaller than the cross-section of outer conductor 104(114). Conductors 102 (112) and 104 (114) are driven by source 108 (118) controlled by controller 109 (119). An external magnetic field $H_{ext}$ may be detected as described with reference to FIGS. 5 and 6, by measuring current through one of the conductors using a monitoring device such as ammeter 105 (115).

The thin film sensors 100 and 110 may be formed using soft ferromagnetic top and bottom layers of about 1 $\mu$m defining shell 106 (116) and a copper middle layer of about 5 $\mu$m in thickness, the width and length of which may be about 1.5 mm and 5 mm respectively defining conductors 102 (112) and 104 (114). Sensors 100 and 110 can be produced by physical vapour deposition using a thin film sputtering machine, in a conventional manner understood by those of ordinary skill.

Conveniently, sensors exemplary of embodiments of the present invention may be used as MEG sensors, and may monitor brain activity and may thus monitor the onset of sleep; blackouts; attention and consciousness; disorientation; and attempts at communication. Such a sensor may for example be used in conjunction with other medical sensors.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A magnetic field sensor, comprising:

a shell made of a magnetic material defining an interior;

a first conductor within said interior;

a second conductor within said interior, nested within said first conductor;

said first and second conductors exhibiting a mutual inductance between each other;

a source of electrical energy, interconnected with said first and second conductors, to establish an alternating electric current through at least one of said first and second conductors, and thereby a magnetic field in said shell;

a monitor, interconnected with one of said first and second conductors, to monitor changes in current therethrough as said shell is brought into proximity with an external magnetic field, to sense a change in permeability of said magnetic material.

2. The sensor of claim 1, wherein said first and second conductors are connected in parallel.

3. The sensor of claim 1, wherein said source provides a constant electrical current.

4. The sensor of claim 1, further comprising a plurality of conductors nested within said first conductor.

5. The sensor of claim 4, wherein said shell comprises a thin film.

6. The sensor of claim 1, wherein said shell comprises a thin film.

7. The sensor of claim 5, wherein said first and second conductors comprise thin conductive strips embedded within said shell.

8. A magnetic field sensor, comprising a magnetic material;

two mutually-coupled conductors driven by a source of alternating electricity to generate a magnetic field in said magnetic material, and having a mutual inductance dependent on the permeability of said magnetic material so that a change in permeability of said magnetic material results in re-distribution of current through said conductors;

a meter for measuring current through at least one of said first and second conductors to sense a change in permeability of said magnetic material caused by an external magnetic field, and thereby said external magnetic field.

9. A method of sensing an external magnetic field, comprising:

inducing a magnetic field in a magnetic element by providing alternating current through first and second mutually-coupled electric conductors having a mutual inductance dependent on the permeability of said magnetic element measuring a change in distribution of current in said two conductors, resulting from said external magnetic field varying the permeability of said magnetic element.

10. A method of sensing a low frequency external magnetic field comprising:

exciting a magnetic element with a time varying magnetic field having a frequency and amplitude to drive the permeability of said magnetic element to a state, at which there is a linear relationship between the permeability of said magnetic element and the external magnetic field to be detected;

sensing said external magnetic field by measuring variation of magnetic flux in said magnetic element, resulting from said external magnetic field.

11. The method of claim 10, wherein the said variation of said magnetic flux is measured by measuring an impedance of said magnetic element connected to an AC circuit.

12. The method of claim 10, wherein said time varying magnetic field is circumferential to the longitudinal extent of said magnetic element.

13. The method of claim 10, wherein said variation of said permeability is measured by measuring an induced voltage in a coil coiling said magnetic element and said times varying magnetic field is parallel to the longitudinal extent of the said magnetic element.

14. The method of claim 10, wherein said frequency and amplitude are selected in dependence on magnetic properties of said magnetic element.

* * * * *